(12) United States Patent
Canniff et al.

(10) Patent No.: US 12,316,340 B2
(45) Date of Patent: May 27, 2025

(54) CONTINUOUS-TIME DELTA-SIGMA ANALOG-TO-DIGITAL CONVERTER

(71) Applicant: Analog Devices, Inc., Wilmington, MA (US)

(72) Inventors: Daniel Canniff, Brookline, MA (US); Mariana Tosheva Markova, Cambridge, MA (US)

(73) Assignee: ANALOG DEVICES, INC., Wilmington, MA (US)

( * ) Notice: Subject to any disclaimer, the term of this patent is extended or adjusted under 35 U.S.C. 154(b) by 93 days.

(21) Appl. No.: 18/157,409

(22) Filed: Jan. 20, 2023

(65) Prior Publication Data
US 2024/0250692 A1 Jul. 25, 2024

(51) Int. Cl.
H03M 1/00 (2006.01)
H03M 1/50 (2006.01)
H03M 1/70 (2006.01)

(52) U.S. Cl.
CPC .............. *H03M 1/50* (2013.01); *H03M 1/70* (2013.01)

(58) Field of Classification Search
CPC .......... H03M 1/50; H03M 1/70; H03M 3/372; H03M 3/464
USPC ........................................ 341/126, 155, 143
See application file for complete search history.

(56) References Cited

U.S. PATENT DOCUMENTS

| | | | |
|---|---|---|---|
| 6,836,228 B1 | 12/2004 | Levinson et al. | |
| 7,095,345 B2 | 8/2006 | Nguyen et al. | |
| 2005/0285763 A1 | 12/2005 | Nguyen et al. | |
| 2010/0066577 A1* | 3/2010 | Huang | H03M 1/0663 341/143 |
| 2013/0044013 A1* | 2/2013 | Braswell | H03M 3/398 341/110 |
| 2014/0285368 A1* | 9/2014 | Anderson | H03M 3/464 341/143 |

FOREIGN PATENT DOCUMENTS

JP 2006-333053 A 12/2006

OTHER PUBLICATIONS

Khiem Nguyen et al., "A 106-dB SNR Hybrid Oversampling Analog-to-Digital Converter for Digital Audio", IEEE Journal of Solid-State Circuits, vol. 40, No. 12, Dec. 2005.

(Continued)

*Primary Examiner* — Jean B Jeanglaude
(74) *Attorney, Agent, or Firm* — ARENTFOX SCHIFF LLP

(57) ABSTRACT

Aspects of the disclosure provide an integrated circuit. The integrated circuit includes an ADC with a continuous time integrator. The continuous time integrator includes an amplifier having an amplifier input and an amplifier output, a capacitor coupled between the amplifier input and the amplifier output, and a resistor. The resistor provides a first current for an integration in response to an analog input. The ADC also includes a DAC configured to generate a second current at an DAC output based on a digital output of the ADC and includes a switch circuit with a first switch circuit terminal coupled with the DAC output and a second switch circuit terminal coupled with the amplifier input. The switch circuit is configured to couple the DAC output with the amplifier input for a summation of the second current with the first current for the integration based on an integration control signal.

21 Claims, 6 Drawing Sheets

(56) References Cited

OTHER PUBLICATIONS

Choi et al., "A 101-dB SNR Hybrid Delta-Sigma Audio ADC using Post Integration Time Control", IEEE 2008 Custom Intergrated Circuits Conference (CICC), XP031361418, ISBN: 978-1-4244-2018-6, 2008, pp. 89-92.
International Search Report and Written Opinion received for PCT Patent Application No. PCT/US2023/083654, mailed on Apr. 23, 2024, 18 pages.
Koc et al., "Direct RF sampling continuous-time bandpass [Delta]—[Sigma] A/D converter design for 3G wireless applications", Proceedings / 2004 Ieee International Symposium on Circuits and Systems ISCAS 2004, XP093147338, ISBN: 978-0-7803-8251-0, vol. 1, May 26, 2004, pp. 409-412.

* cited by examiner

CONTINUOUS-TIME DELTA-SIGMA ANALOG-TO-DIGITAL CONVERTER

BACKGROUND

Some electronic devices, such as audio devices, measurement devices, and the like, may require low power analog-to-digital converters (ADCs) with high dynamic range. For example, for wireless audio devices, such as wireless earbuds, low power can increase battery life, and high dynamic range can allow high fidelity audio processing in active noise cancelling. Current solutions, however, may fail to address clock jitter and/or signal aliasing issues, which reduces the robustness of the electronic device. Thus, improvements in electronic devices with low power ADCs with high dynamic range are desired.

SUMMARY

The following presents a simplified summary of one or more aspects in order to provide a basic understanding of such aspects. This summary is not an extensive overview of all contemplated aspects and is intended to neither identify key or critical elements of all aspects nor delineate the scope of any or all aspects. Its sole purpose is to present some concepts of one or more aspects in a simplified form as a prelude to the more detailed description that is presented later.

Aspects of the disclosure provide an integrated circuit. The integrated circuit includes an analog to digital converter (ADC). The ADC includes a continuous time integrator. The continuous time integrator includes an amplifier having an amplifier input and an amplifier output, a capacitor coupled between the amplifier input and the amplifier output, and a resistor with a first resistor terminal configured to receive an analog input and a second resistor terminal coupled to the amplifier input. The resistor is configured to provide a first current for an integration. The ADC also includes a digital to analog converter (DAC) configured to generate a second current at an DAC output based on a digital output of the ADC and includes a switch circuit with a first switch circuit terminal coupled with the DAC output and a second switch circuit terminal coupled with the amplifier input. The switch circuit is configured to couple the DAC output with the amplifier input for a summation of the second current with the first current for the integration based on an integration control signal. It is noted that, in some examples, the ADC can include additional continuous time integrator, DAC and switch circuit that are configured in a similar manner as above or configured in a different manner. It is also noted that, in an example, the ADC is configured for processing single ended signals; and in another example, components in the ADC are configured for processing differential signals.

In some examples, the ADC includes an integration control generator configured to generate the integration control signal based on a mode of the DAC. In an example, in a first mode of the DAC, the integration control generator is configured to generate the integration control signal as a clock signal with a constant on time in a clock period, the constant on time corresponds to an integration time for the continuous time integrator. For example, the integration control generator includes a timing control loop circuit configured to generate the clock signal with the constant on time set based on a resistor-capacitor time constant.

In another examples, in a second mode of the DAC, the integration control generator is configured to generate the integration control signal with a constant non zero voltage level.

In some examples, the ADC includes a first configuration switch configured to couple the second resistor terminal with the amplifier input in the first mode and the second mode of the DAC, and a second configuration switch configured to decouple the second resistor terminal from the first switch circuit terminal of the switch circuit in the first mode and the second mode of the DAC. In an example, the first configuration switch is configured to decouple the second resistor terminal from the amplifier input in a third mode of the DAC, and the second configuration switch is configured to couple the second resistor terminal with the first switch circuit terminal of the switch circuit in the third mode of the DAC. In the third mode of the DAC, the integration control generator is configured to generate the integration control signal as a clock signal with an adjustable on time of a non zero voltage level in a clock period, the adjustable on time corresponds to an adjustable integration time for the continuous time integrator.

In some examples, the ADC includes a configuration circuit configured to generate one or more configuration control signals for controlling the first configuration switch and the second configuration switch in response to a selected mode from the first mode, the second mode and the third mode of the DAC.

Some aspects of the disclosure provide a method of operating an analog to digital converter (ADC). The method includes generating, by a resistor, a first current in response to an analog input, and generating, by a digital to analog converter (DAC), a second current in response to a digital output of the ADC. The method further includes controlling a switch circuit based on an integration control signal to transmit the second current to a summing node and combining the first current and the second current at the summing node to generate an integration current. Further, the method includes integrating the integration current over a capacitor to generate an integration output and adjusting the digital output based on the integration output.

In some examples, the method includes generating the integration control signal based on a mode of the DAC.

In an example, in a first mode of the DAC, the method includes generating the integration control signal as a clock signal with a constant on time in a clock period, the constant on time corresponds to an integration time.

In another example, in a second mode of the DAC, the method includes generating the integration control signal with a constant non zero voltage level.

In some examples, the method includes coupling the resistor with the capacitor in the first mode and the second mode of the DAC and decoupling the resistor from the switch circuit in the first mode and the second mode of the DAC.

In some examples, the method includes decoupling the resistor from the capacitor in a third mode of the DAC and coupling the resistor with the switch circuit in the third mode of the DAC.

In an example, in the third mode of the DAC, the method includes generating the integration control signal as a clock signal with an adjustable on time of a non zero voltage level in a clock period, the adjustable on time corresponding to an adjustable integration time.

In some examples, the method also includes generating one or more configuration control signals in response to a selected mode from the first mode, the second mode and the third mode of the DAC.

Aspects of the disclosure also provide a method of using an analog to digital converter (ADC). The method includes storing a selected mode of a digital to analog converter (DAC) in the ADC, generating one or more configuration control signals based on the selected mode of the DAC, and generating an integration control signal based on the selected mode of the DAC. The method further includes configuring a summing node for combining a first current and a second current as one of a first terminal of a switch circuit and a second terminal of the switch circuit based on the one or more configuration control signals, the first current is generated in response to an analog input, the second current is generated from an output terminal of the DAC in response to a digital output of the ADC, the first terminal of the switch circuit is coupled with the output terminal of the DAC, and the second terminal of the switch circuit is coupled with a capacitor for integration. The method further includes controlling the switch circuit based on the integration control signal. A combined current of the first current and the second current is provided to the capacitor for generating an integration output and the digital output of the ADC is adjusted based on the integration output.

In some examples, the selected mode is a first mode, the method includes generating the one or more configuration control signals that configure the summing node as the second terminal of the switch circuit and generating the integration control signal as a clock signal with a constant on time in a clock period, the constant on time corresponds to an integration time.

In some examples, the selected mode is a second mode, the method includes generating the one or more configuration control signals that configure the summing node as the second terminal of the switch circuit and generating the integration control signal with a constant non zero voltage level.

In some examples, the selected mode is a third mode, the method includes generating the one or more configuration control signals that configure the summing node as the first terminal of the switch circuit and generating the integration control signal as a clock signal with an adjustable on time of a non zero voltage level in a clock period, the adjustable on time corresponds to an adjustable integration time.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Generally, a continuous-time delta-sigma analog-to-digital converter (ADC) includes a continuous time (CT) delta-sigma (DS) modulator (also referred to as CT-DS modulator) that encodes an analog signal into a digital signal by oversampling with a much higher frequency than the signal band of the analog signal. The CT-DS modulator uses a digital-to-analog converter (DAC) to generate a feedback signal from the digital signal, and the feedback signal is combined with the analog signal at summing junctions (also referred to as a delta modulation) to generate an error signal. The error signal is integrated (also referred to as a sigma modulation). The CT-DS modulator can adjust the digital signal based on the integrated error signal. The CT-DS modulator can meet the demands for both high dynamic range and low power and excellent robustness due to inherent anti-aliasing filter (AAF) property of the CT-DS modulator.

In some related examples, switches are added at (e.g., after) summing junctions of the delta modulation, the switches are controlled by a clock signal to apply a return to zero (RTZ) scheme that can reduce inter-symbol interference (ISI). The switches at the summing junctions can cause periodic switching of the DAC which modulates a loop gain periodically and causes the CT-DS modulator to be a periodic time varying system. According to an aspect of the disclosure, the switches at the summing junctions can degrade anti-aliasing rejection and can introduce excess noise from higher frequency to alias into the signal band (referred to as excess noise folding).

Some aspects of the present disclosure provide a DAC architecture with switches at the DAC outputs before the summing junctions, the DAC architecture can be used in a continuous-time delta-sigma ADC. The position change of the switches can alleviate the degradation of anti-aliasing rejection and excess noise folding, and the DAC architecture can achieve jitter tolerance without AAF impact or excess noise while maintaining low power and high linearity.

Further, some aspects of the present disclosure provide a tri-mode DAC architecture for use in a continuous-time delta-sigma ADC, the tri-mode DAC architecture can be reconfigured into various modes to enable trade-off of power and performance depending on system requirements.

Figure 1:
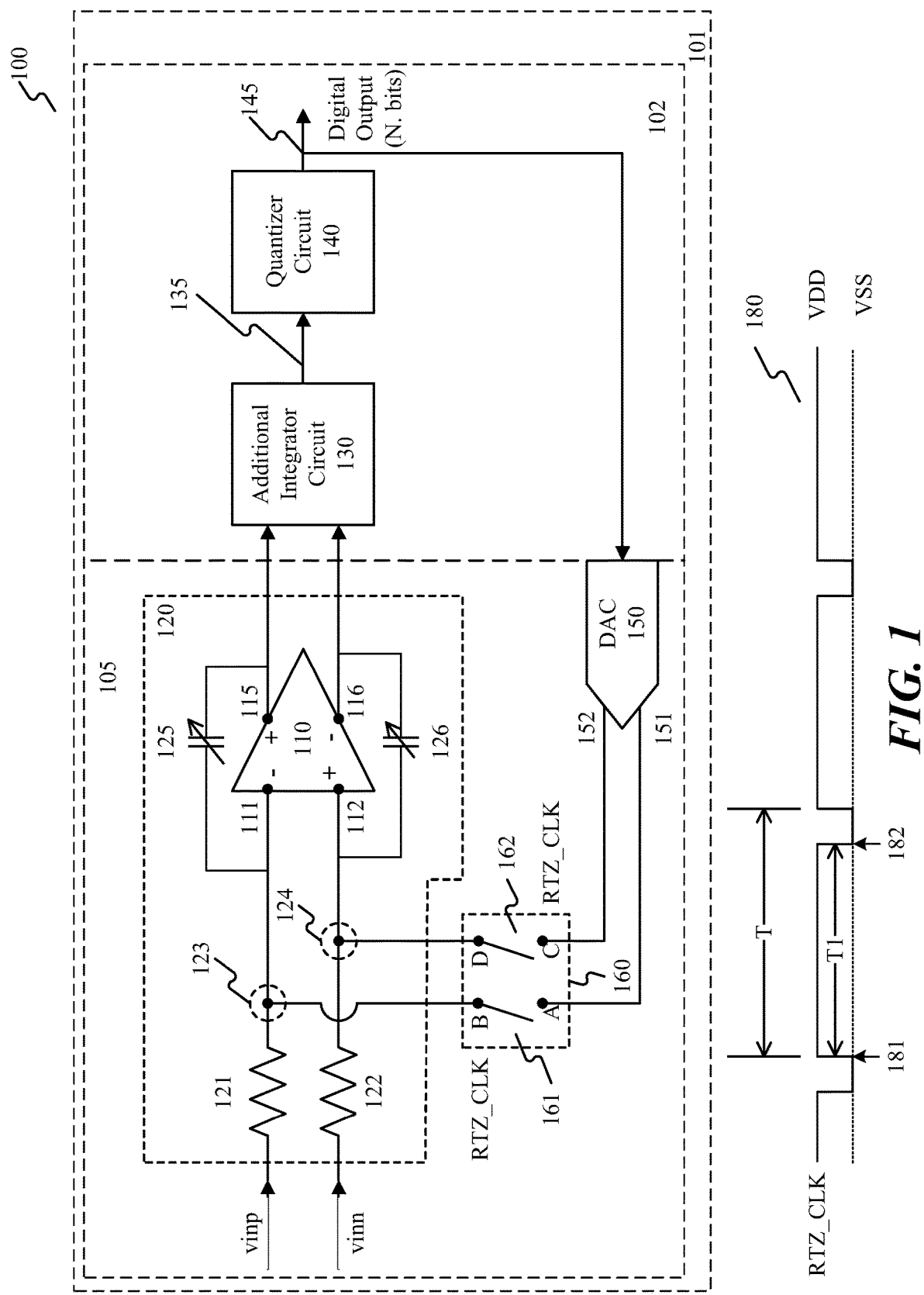
FIG. 1 shows a diagram of an analog-to-digital converter (ADC) with a digital-to-analog converter (DAC) architecture according to some aspects of the disclosure.

FIG. 1 shows a diagram of an integrated circuit 100 with an ADC 101 according to some aspects of the disclosure. The ADC 101 is a continuous-time delta-sigma ADC that includes a CT-DS modulator 102. The CT-DS modulator 102 uses a DAC architecture with switches at the DAC outputs before summing junctions.

In the FIG. 1 example, the CT-DS modulator 102 includes one or more integrator circuits, such as a first integrator circuit 120 and an additional integrator circuit 130 as shown in FIG. 1, a quantizer circuit 140, a DAC 150, and a switch module 160 coupled together in a loop as shown in FIG. 1. The first integrator circuit 120 includes summing nodes 123 and 124 (also referred to as summing junctions) where an analog input is combined with a feedback signal. For example, at the summing nodes, the feedback signal is subtracted from the analog input to generate a difference (representing the "delta"). The difference can be integrated (representing the "sigma") by the first integrator circuit 120 and the additional integrator circuit 130.

In some examples, the first integrator circuit 120 and the additional integrator circuit 130 form a loop filter circuit. The loop filter circuit can feed an integrated difference signal 135 to the quantizer circuit 140.

The quantizer circuit 140 can adjust a digital output signal 145, such as an N-bit digital value corresponding to the analog input, based on the integrated difference signal 135. In some examples, the quantizer circuit 140 is implemented by a coarse ADC such as a multi-bit flash ADC and the like. The digital output signal 145 can be used to generate the feedback signal via a feedback processing path including the DAC circuit 150. The feedback processing path can perform noise shaping and other processing, such as using a dynamic element matching (DEM) technique with the DAC circuit 150. The feedback signal is provided to the summing node via the switch module 160.

It is noted that while FIG. 1 shows an example of circuitry for processing differential signals, the circuitry can be suitably modified for processing single ended signals.

In the FIG. 1 example, the analog input is provided as a differential voltage signal vinp and vinn, and the first integrator circuit 120 is configured in a differential configuration to process the differential voltage signal vinp and vinn. The first integrator circuit 120 includes an operational amplifier 110 that is a differential amplifier with amplifier inputs 111 and 112 and amplifier outputs 115 and 116, the amplifier inputs 111 and 112 are a differential pair of amplifier inputs, and the amplifier outputs 115 and 116 are a differential pair of amplifier outputs.

The first integrator circuit 120 also includes components in differential pairs to process the differential voltage signal vinp and vinn. For example, the first integrator circuit 120 includes a pair of resistors 121 and 122 that is a differential pair, and includes a pair of capacitors 125 and 126 that is a differential pair. The resistor 121 is coupled to the amplifier input 111, and the resistor 122 is coupled to the amplifier input 112. The pair of resistors 121 and 122 can convert the differential voltage signal into a first differential current signal. The capacitor 125 is coupled between the amplifier input 111 and the amplifier output 115, and the capacitor 126 is coupled between the amplifier input 112 and the amplifier output 116. The pair of capacitors 125 and 126 provide capacitive feedback from the amplifier outputs to the amplifier inputs. Thus, a differential output voltage by the amplifier outputs 115 and 116 can be proportional to an integral of a differential charging current on the pair of capacitors 125 and 126. In some examples, the pair of capacitors 125 and 126 are programmable and the capacitance of the pair of capacitors 125 and 126 can be adjusted based on a programmable code.

In the FIG. 1 example, the first integrator circuit 120 includes a pair of summing nodes 123 and 124 that can combine the first differential current signal with a second differential current signal provided by the DAC 150 via the switch module 160 to generate the differential charging current for integration. The switch module 160 includes a pair of switch circuits 161 and 162 that couples DAC outputs 151 and 152 (a differential pair) of the DAC 150 to the pair of summing nodes 123 and 124. The DAC 150 is configured to output the second differential current signal from the DAC outputs 151 and 152 based on the digital output signal 145. The switch circuit 161 includes a first switch circuit terminal (shown by A in FIG. 1) coupled with the DAC output 151, and includes a second switch circuit terminal (shown by B in FIG. 1) coupled with the summing node 123. The switch circuit 162 includes a first switch circuit terminal (shown by C in FIG. 1) coupled with the DAC output 152, and includes a second switch circuit terminal (shown by D in FIG. 1) coupled with the summing node 124. It is noted that, in an example, the DAC 150 is a current mode DAC that outputs the second differential current signal; and in another example, the DAC 150 includes a voltage mode DAC and resistors that convert a differential voltage signal output from the voltage mode DAC to the second differential current signal.

In some examples, a switch circuit, such as the switch circuit 161, the switch circuit 162, and the like is implemented using a complementary metal oxide semiconductor (CMOS) switch with relatively low turn on resistance. The CMOS switch is turned on (closed) or turned off (open) in response to a control signal.

In the FIG. 1 example, the switch circuits 161 and 162 are controlled by an integration control signal shown by RTZ_CLK in FIG. 1. In an example, when the integration control signal is logic 1 (a relatively high voltage level, e.g., VDD, the high voltage supply level), the switch circuits 161 and 162 are closed, thus the DAC output 151 is coupled to the summing node 123, and the DAC output 152 is coupled to the summing node 124; when the integration control signal is logic 0 (a relative low voltage level, e.g., VSS, the low voltage supply level), the switch circuits 161 and 162 are open, thus the DAC output 151 is decoupled from the summing node 123, and the DAC output 152 is decoupled from the summing node 124.

In the FIG. 1 example, the integration control signal is a clock signal with a constant turn on time. FIG. 1 shows a waveform 180 of the integration control signal. The integration control signal is a clock signal with a period T, and a constant turn on time T1 in each clock cycle. In some examples, the integration control signal is generated by a timing control loop circuit (not shown) based on a modulation clock, such as a DAC clock signal used in the DAC 150. In an example, a rising edge 181 of the integration control signal is generated in response to a rising edge in the DAC clock signal. The timing control loop circuit can include a hysteresis comparator to keep the integration control signal of a high voltage level (turn on) for a time based on a RC value of a resistor and a capacitor in the timing control loop circuit, the resistor and the capacitor can have constant RC value during operation, thus the turn on time (T1) of the integration control signal can be constant. Thus, the falling edge 182 is generated based on the RC valuem not based on the falling edge of the DAC clock signal, and the integration control signal RTZ_CLK is referred to as self-timed.

In some examples, the CT-DS modulator 102 is an oversampling modulator, the sampling frequency of the modulation clock can have an oversampling ratio that is much larger than 2. In an example, the oversampling ratio is over 100. For example, when the bandwidth of the analog input is 20 Hz to 20 KHz, the sampling frequency of the modulation clock is over 2 MHz.

In the FIG. 1 example, the ADC 101 is based on a DAC architecture 105 that includes the DAC 150, the first integrator circuit 120, the switch module 160 that the couples the DAC 150 to the first integrator circuit 120, and the integration control signal RTZ_CLK with the waveform 180 for controlling the switch module 160. The DAC architecture 105 can be referred to as RTZ-CT implementation.

Figure 2:
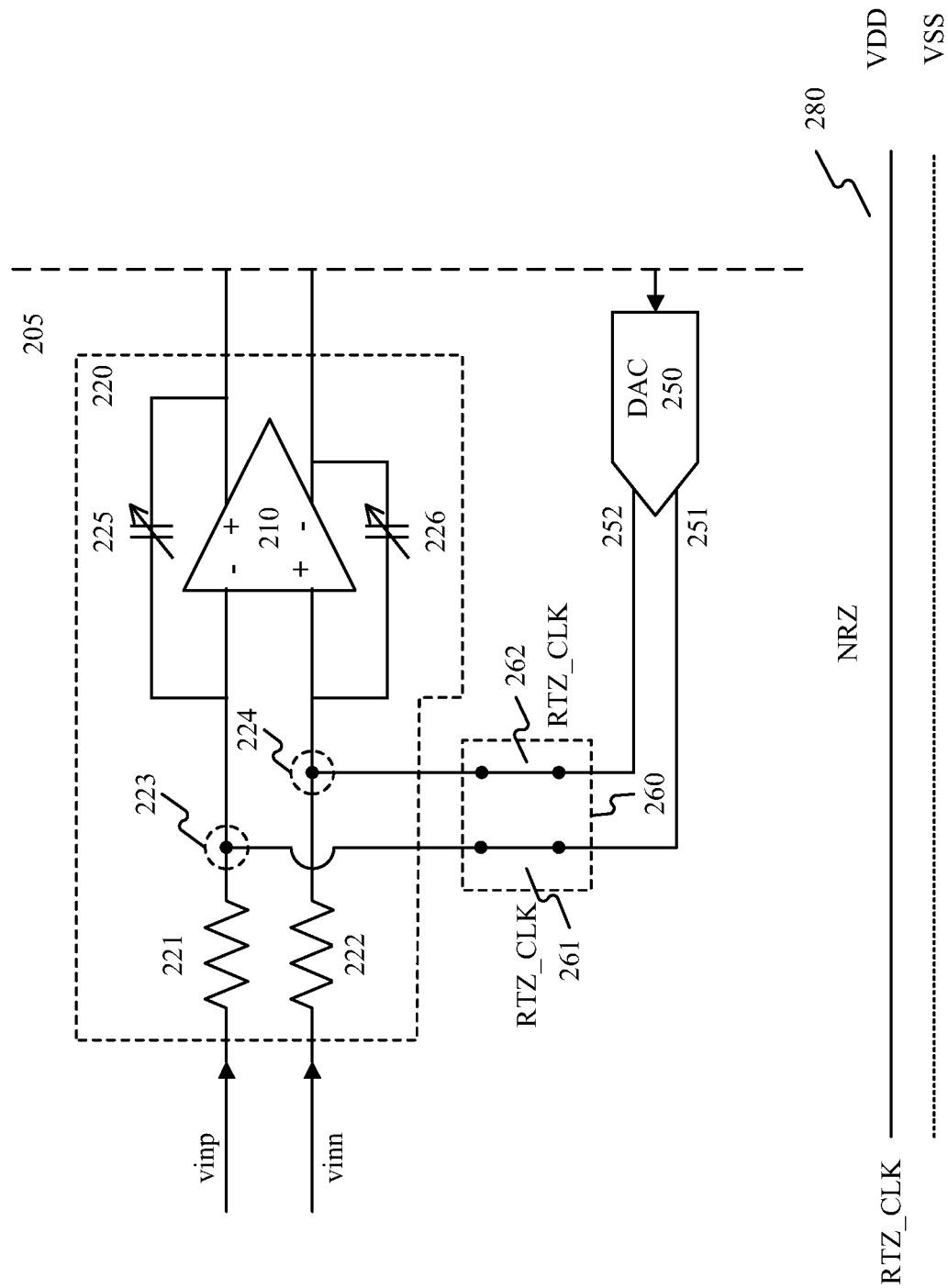
FIG. 2 shows a diagram of another DAC architecture in some examples.
Figure 3:
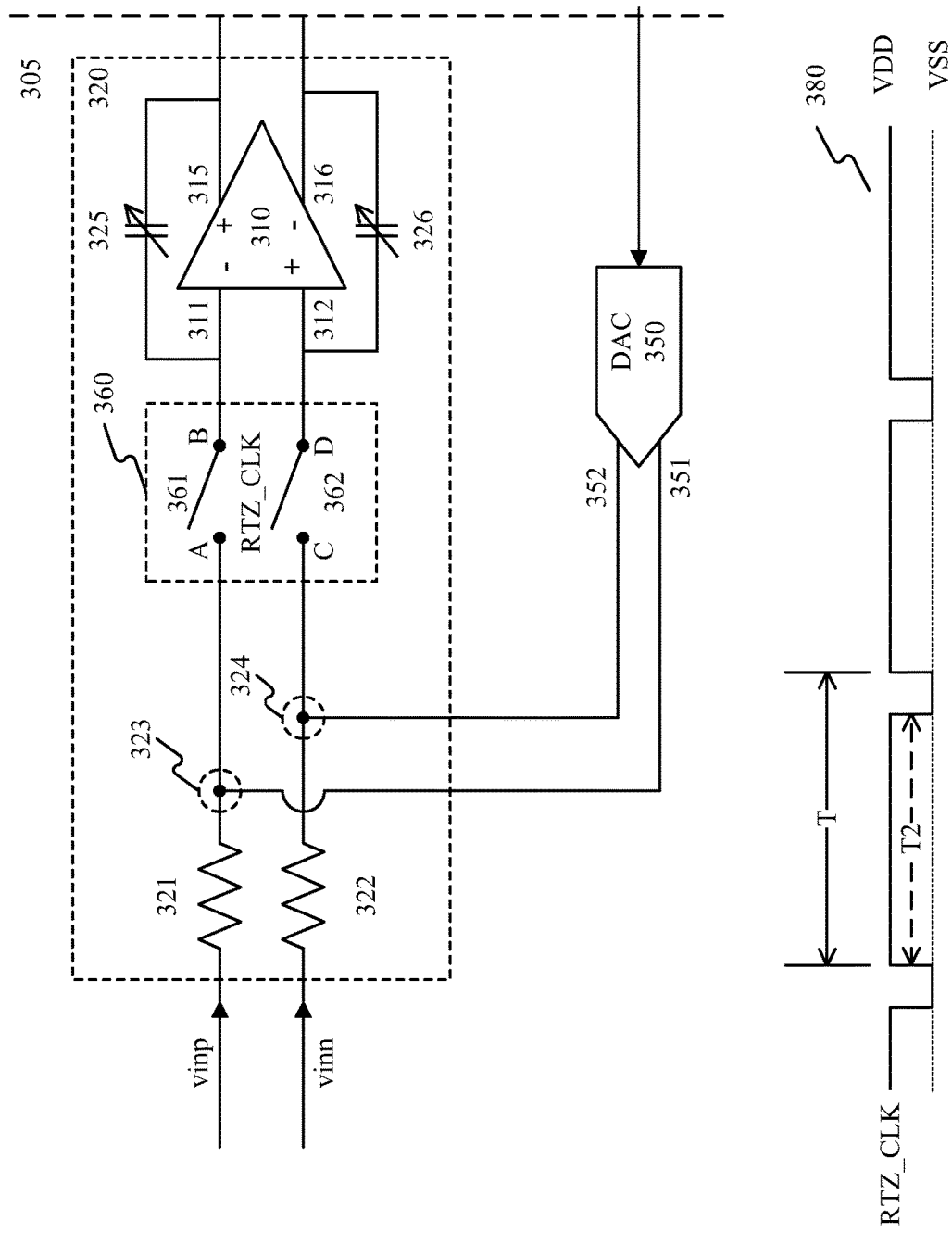
FIG. 3 shows a diagram of another DAC architecture in some examples.

FIG. 2 and FIG. 3 shows other DAC architectures in some examples.

FIG. 2 shows a diagram of a DAC architecture 205 in some examples. The DAC architecture 205 can have DAC outputs constantly coupled to summing nodes during operation in some examples. The DAC architecture 205 is also referred to as NRZ implementation. While FIG. 2 only shows the DAC architecture 205, it is noted that the DAC architecture 205 can be coupled with other suitable circuitry, such as the additional integrator circuit 130, the quantizer circuit 140 in similar configuration as the DAC architecture 105 to form CT-DS modulator, the detail description of the other circuitry has been provided above and will be omitted here for clarity purpose.

In the FIG. 2 example, the DAC architecture 205 includes a first integrator circuit 220, a DAC 250 and a switch module 260 coupled together.

The first integrator circuit 220 includes a pair of resistors 221 and 222, a pair of summing nodes 223 and 224, a pair of capacitors 225 and 226 and an operational amplifier 210. The pair of resistors 221 and 222 is identical or equivalent to the pair of resistors 121 and 122; the pair of summing nodes 223 and 224 is identical or equivalent to the pair of summing nodes 123 and 124; the pair of capacitors 225 and 226 is identical or equivalent to the pair of capacitors 125 and 126; and the operational amplifier 210 is identical or equivalent to the operational amplifier 110. The DAC 250 is identical or equivalent to the DAC 150. The switch module 260 includes a pair of switch circuits 261 and 262 that is identical or equivalent to the pair of switch circuits 161 and 162. The description of these components has been provided above and will be omitted here for clarity purposes.

In the FIG. 2 example, the switch circuits 261 and 262 are controlled by an integration control signal RTZ_CLK with a waveform 280. According to the waveform 280, the integration control signal is generated in a non return to zero (NRZ) form, thus the integration control signal constantly has logic 1 value (a relatively high voltage level, e.g., a high voltage supply level, VDD). In an example, during operation, in response to the integration control signal being logic 1, the switch circuits 261 and 262 are closed constantly, thus the DAC output 251 is constantly coupled to the summing node 223, and the DAC output 252 is constantly coupled to the summing node 224.

It is noted, in some examples, each of the switch circuits 261 and 262 can be replaced by a conductive wire, or other suitable coupling technique.

FIG. 3 shows a DAC architecture 305 with DAC outputs coupled to summing nodes before switches in some examples. The DAC architecture 305 is also referred to as RTZ-SJ implementation. While FIG. 3 only shows the DAC architecture 305, it is noted that the DAC architecture 305 can be coupled with other suitable circuitry, such as the additional integrator circuit 130, the quantizer circuit 140 in similar configuration as the DAC architecture 105, the detail description of the other circuitry has been provided above and will be omitted here for clarity purpose.

In the FIG. 3 example, the DAC architecture 305 includes a first integrator circuit 320, a DAC 350 and a switch module 360 coupled together.

The first integrator circuit 320 includes a pair of resistors 321 and 322, a pair of capacitors 325 and 326 and an operational amplifier 310. The pair of resistors 321 and 322 is identical or equivalent to the pair of resistors 121 and 122; the pair of capacitors 325 and 326 is identical or equivalent to the pair of capacitors 125 and 126; and the operational amplifier 310 is identical or equivalent to the operational amplifier 110. The DAC 350 is identical or equivalent to the DAC 150. The switch module 360 includes a pair of switch circuits 361 and 362 that is identical or equivalent to the pair of switch circuits 161 and 162. The description of these components has been provided above and will be omitted here for clarity purposes.

In the FIG. 3 example, the switch module 360 is placed after the summing nodes. The pair of DAC outputs 351 and 352 is coupled directly to the pair of summing nodes 323 and 324 to provide the second differential current signal to the summing nodes. The pair of summing nodes 323 and 324 can combine the first differential current signal (generated in response to the differential input voltage signal vinp and vinn) with the second differential current signal provided by the DAC 350 to generate the differential charging current for integration. The switch module 360 includes the pair of switch circuits 361 and 362 that couples the pair of summing nodes 323 and 324 to the pair of amplifier inputs 311 and 312. The switch circuit 361 includes a first switch circuit terminal (shown by A in FIG. 3) coupled with the summing node 323, and includes a second switch circuit terminal (shown by B in FIG. 3) coupled with the amplifier input 311. The switch circuit 362 includes a first switch circuit terminal (shown by C in FIG. 3) coupled with the summing node 324, and includes a second switch circuit terminal (shown by D in FIG. 1) coupled with the amplifier input 312.

The switch circuits 361 and 362 are controlled by an integration control signal shown by RTZ_CLK in FIG. 3. In an example, when the integration control signal is logic 1 (a relatively high voltage level, e.g., VDD, the high voltage supply level), the switch circuits 361 and 362 are closed, thus the summing node 323 is coupled to the amplifier input 311, and the summing node 324 is coupled to the amplifier input 312; when the integration control signal is logic 0 (a relative low voltage level, e.g., VSS, the low voltage supply level), the switch circuits 361 and 362 are open, thus the summing node 323 is decoupled from the amplifier input 311, and the summing node 324 is decoupled from the amplifier input 312.

In the FIG. 3 example, the integration control signal is a clock signal with a tunable turn on time. FIG. 3 shows a waveform 380 of the integration control signal. The integration control signal is a clock signal with a period T, and a tunable turn on time T2 in each clock cycle. In some examples, the integration control signal is generated by a timing control loop circuit (not shown) based on a modulation clock, such as a DAC clock signal used in the DAC 350. In an example, a rising edge 381 of the integration control signal is generated in response to a rising edge in the DAC clock signal. The timing control loop circuit can include a hysteresis comparator to keep the integration control signal of a high voltage level (turn on) for a time based on a RC value of a resistor and a programmable capacitor in the timing control loop circuit, the programmable capacitor can have capacitance that is tuned based on program control code during operation, thus the turn on time (T2) of the integration control signal can be tuned. Thus, the falling edge 382 is generated based on the RC value not based on the falling edge of the DAC clock signal, and the integration control signal RTZ_CLK is referred to as self-timed.

According to an aspect of the disclosure, the DAC architecture 305 (RTZ-SJ implementation) can calibrate for constant integrator gain using integration time and tunable capacitance. The DAC architecture 305 is configured for self-timed DAC operation, and has good jitter tolerance, supports variable ADC sample rates, and can be implemented with small capacitor area. The switches 361 and 362 at the summing junctions can cause periodic switching of the DAC which modulates the loop gain around the operational amplifier, and create a periodic time varying system that degrades anti-alias rejection of CT-DS modulator and causes operational transconductance amplifier (OTA) noise from higher frequencies to alias into the signal band.

According to another aspect of the disclosure, the DAC architecture 105 (RTZ-CT implementation) is also configured for self-timed DAC operation. The robustness to external clock jitter is maintained using a self-timed RTZ clock generator (e.g., using timing control loop circuit). Comparing the DAC architecture 105 with the DAC architecture 305, the switch module 160 is before the summing nodes, and the switch module 360 is after the summing nodes. The position change of the switch module removes the source of the AAF degradation and excess noise folding.

In the DAC architecture 105, the integration time (T1) is constant and no longer variable and cannot be used to calibrate the gain as is used in the DAC architecture 305. In an example, integrator gain in DAC architecture 105 can be calibrated using a larger capacitance value, therefore larger capacitor area is used. In some examples, low geometry process is used with high density capacitance, then the increase of capacitor area is not a key issue.

In some examples, in the DAC architecture 105, the loop filter (e.g., the first integrator circuit 120) can experience larger transients at the summing junctions, and amplifiers with high slew and low power can be used in the loop filter. The DAC architecture 105 does not support variable sampling rate.

According to an aspect of the disclosure, the DAC architecture 205 (NRZ implementation) bypasses the self-timed DAC operation, and keeps the DAC connected with any reset (hold) phase for an NRZ DAC implementation. The DAC architecture 205 has excellent AAF response, and has low power in loop filter and no extra clock generator power consumption. The jitter tolerance of the DAC architecture 205 is reduced comparing to the DAC architecture 105 and the DAC architecture 305. The DAC architecture 205 does not support variable sampling rate, and has high sensitivity to ISI.

According to an aspect of the disclosure, the DAC architecture 105, the DAC architecture 205 and the DAC architecture 305 have different performance regarding ISI reduction, noise level, power consumption, jitter tolerance, anialiasing filtering (AAF), and capacitor area. The DAC architecture 305 can have good ISI reduction, good jitter tolerance and small capacitor area. However, the DAC architecture 305 may have relatively high noise level, high power consumption and degraded AAF. The DAC architecture 105 can have good ISI reduction, low noise level, good jitter tolerance and improved AAF. The DAC architecture 105 may have relatively high power consumption and a large capacitor area. The DAC architecture 205 can have a low noise level, a reduced power consumption, and an improved AAF. The DAC architecture 205 may experience ISI, and have low jitter tolerance and large capacitor area.

Some aspects of the present disclosure provide a tri-mode DAC architecture for use in in a continuous-time delta-sigma ADC, the tri-mode DAC architecture can be reconfigured into various modes, such as the NRZ implementation, the RTZ-SJ implementation, the RTZ-CT implementation, and the like to enable trade-off of power and performance depending on system requirements.

Figure 4:
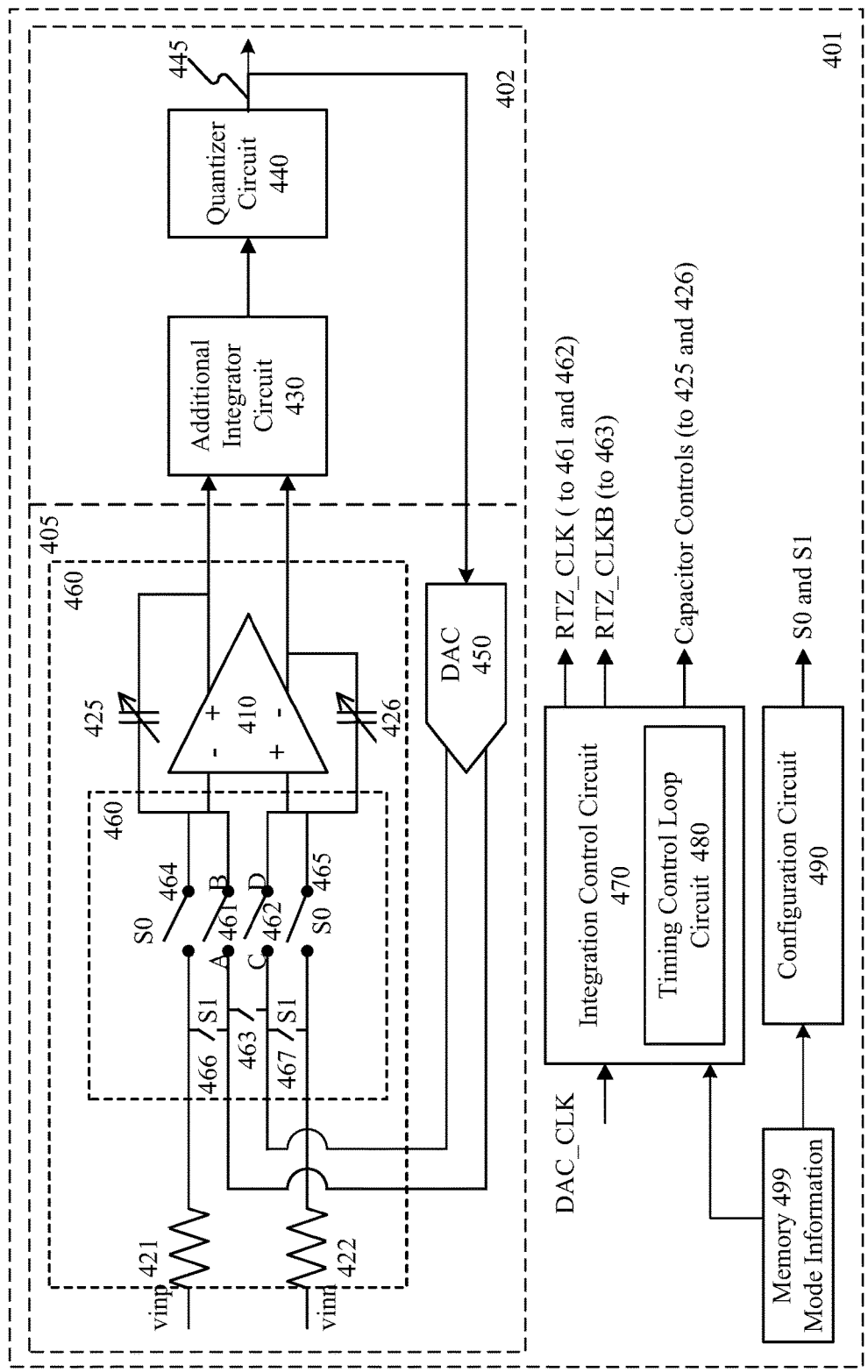
FIG. 4 shows a diagram of a reconfigurable ADC with a tri-mode DAC architecture according to some aspects of the disclosure.

FIG. 4 shows a diagram of a reconfigurable ADC 401 according to some aspects of the disclosure. The reconfigurable ADC 401 includes a tri-mode DAC architecture 405 that can be configured into a first mode of RTZ-CT implementation, a second mode of NRZ implementation and a third mode of RTZ-SJ implementation. The reconfigurable ADC 401 includes an integration control circuit 470 and a configuration circuit 490. In some examples, mode information can be stored, for example in a non-volatile memory 499. The configuration circuit 490 can generate control signals S0 and S1 (also referred to as configuration control signals in some examples) based on the mode information. The integration control circuit 480 can generate the integration control signals RTZ-CLK and RTZ-CLKB based on the mode information. The integration control signal RTZ-CLKB is an inversion of the integration control signal RTZ-CLK. The tri-mode DAC architecture 405 is configured into one of the first mode, the second mode and the third mode based on the control signals S0 and S1, and the integration control signals RTZ-CLK and RTZ-CLKB. It is also noted that, in some examples, the integration control circuit 470 also provides capacitor controls (e.g., one or more bits) to control variable capacitors, such as a pair of variable capacitors 425 and 426.

The reconfigurable ADC 401 is a continuous-time delta-sigma ADC that includes a CT-DS modulator 402. The CT-DS modulator 402 includes the tri-mode DAC architecture 405, an additional integrator circuit 430, and a quantizer circuit 440. The additional integrator circuit 430 is identical or equivalent to the additional integrator circuit 130, the quantizer circuit 440 is identical or equivalent to the quantizer circuit 140. The description of these components has been provided above and will be omitted here for clarity purposes.

In the FIG. 4 example, the tri-mode DAC architecture 405 includes a first integrator circuit 420, a DAC 450 and a switch module 460 coupled together. The first integrator circuit 420 includes a pair of resistors 421 and 422, a pair of capacitors 425 and 426 and an operational amplifier 410. The pair of resistors 421 and 422 is identical or equivalent to the pair of resistors 121 and 122; the pair of variable capacitors 425 and 426 is identical or equivalent to the pair of capacitors 125 and 126; and the operational amplifier 410 is identical or equivalent to the operational amplifier 110. The DAC 450 is identical or equivalent to the DAC 150. The description of these components has been provided above and will be omitted here for clarity purposes.

In the FIG. 4 examples, the switch module 460 includes switch circuits 461-467. The switch circuits 461 and 462 are controlled by the integration control signal RTZ_CLK, the switch circuit 463 is controlled by the integration control signal RTZ_CLKB. The switch circuits 464 and 465 are controlled by the control signal S0. The switch circuits 466 and 467 are controlled by the control signal S1.

In some examples, the switch circuits 461-467 are implemented by CMOS switches with relatively low turn on resistance. A CMOS switch is turned on (closed) or turned off (open) in response to a control signal. For example, during operation, the CMOS switch is closed in response to the control signal being logic 1 and is open in response to the control signal being logic 0.

In an example, the mode information in the memory 499 is indicative of the first mode of RTZ-CT implementation. When circuitry is powered up, the configuration circuit 490 outputs the control signal S0 of logic 1, and the control signal S1 of logic 0. Thus, the switch circuits 464 and 465 are closed, the switch circuits 466 and 467 are open after the power up and during operation. The integration control circuit 470 includes a timing control loop circuit 480 that generates the integration control signals RTZ_CLK and RTZ_CLKB based on a modulation clock, such as a DAC clock signal used in the DAC 450 (shown by DAC_CLK in FIG. 4). In response to the first mode, the timing control loop circuit 480 can output the integration control signal RTZ_CLK with the waveform 180. Thus, the tri-mode DAC architecture 405 is configured equivalent to the DAC architecture 105.

In another example, the mode information in the memory 499 is indicative of the second mode of NRZ implementation. When circuitry is powered up, the configuration circuit 490 outputs the control signal S0 of logic 1, and the control signal S1 of logic 0. Thus, the switch circuits 464 and 465 are closed, the switch circuits 466 and 467 are open after the power up and during operation. In response to the second mode, the timing control loop circuit 480 can output the integration control signal RTZ_CLK with the waveform 280. Thus, the tri-mode DAC architecture 405 is configured equivalent to the DAC architecture 205.

In another example, the mode information in the memory 499 is indicative of the third mode of RTZ-SJ implementation. When circuitry is powered up, the configuration circuit 490 outputs the control signal S0 of logic 0, and the control signal S1 of logic 1. Thus, the switch circuits 464 and 465 are open, the switch circuits 466 and 467 are closed after the power up and during operation. In response to the third mode, the timing control loop circuit 480 can output the integration control signal RTZ_CLK with the waveform 380. Thus, the tri-mode DAC architecture 405 is configured equivalent to the DAC architecture 305.

According to an aspect of the disclosure, the reconfigurable ADC 401 can have different specifications based on the mode of the tri-mode DAC architecture 405.

According to an aspect of the disclosure, the reconfigurable ADC 401 has the best power specification (e.g., lowest power consumption) when the tri-mode DAC architecture 405 is in the second mode of NRZ implementation because of NRZ of the integration control signal. The switching operations in the timing control loop circuit 480, and the switching operations of the switch circuits 461-463 are reduced. It is also noted that the reconfigurable ADC 401 with the tri-mode DAC architecture 405 in the third mode may have the better power specification than the tri-mode DAC architecture 405 in the first mode due to higher current in the operational amplifier in the first mode.

According to an aspect of the disclosure, the reconfigurable ADC 401 has the improved jitter tolerance when the tri-mode DAC architecture 405 is in the first mode or the third mode, and may have reduced jitter tolerance when the tri-mode DAC architecture 405 is in the second mode.

According to an aspect of the disclosure, the reconfigurable ADC 401 has the best AAF response when the tri-mode DAC architecture 405 is in the second mode, has good AAF response when the tri-mode DAC architecture 405 is in the first mode, and weak AAF response when the tri-mode DAC architecture 405 is in the third mode.

According to an aspect of the disclosure, the reconfigurable ADC 401 has the best ISI reduction when the tri-mode DAC architecture 405 is in the third mode, has good ISI reduction when the tri-mode DAC architecture 405 is in the first mode.

According to an aspect of the disclosure, the reconfigurable ADC 401 has excess noise when the tri-mode DAC architecture 405 is in the third mode due to sampling noise in the hold phase (e.g., RTZ_CLK being zero).

According to an aspect of the disclosure, the reconfigurable ADC 401 can support variable sampling rates when the tri-mode DAC architecture 405 is in the third mode.

In some examples, the second mode (NRZ implementation) is the default mode for the tri-mode DAC architecture 405. In the second mode, the reconfigurable ADC 401 has the lowest power consumption and good AAF response. In an example, higher resolution DAC is used to migrate lower jitter tolerance.

In some examples, when AAF response, jitter tolerance and no noise folding are required, the tri-mode DAC architecture 405 can be configured into the first mode (RTZ-CT implementation) to meet the requirement.

In some examples, variable sampling rates are required, the tri-mode DAC architecture 405 can be configured into the second mode (RTZ-SJ implementation) to meet the requirement.

Figure 5:
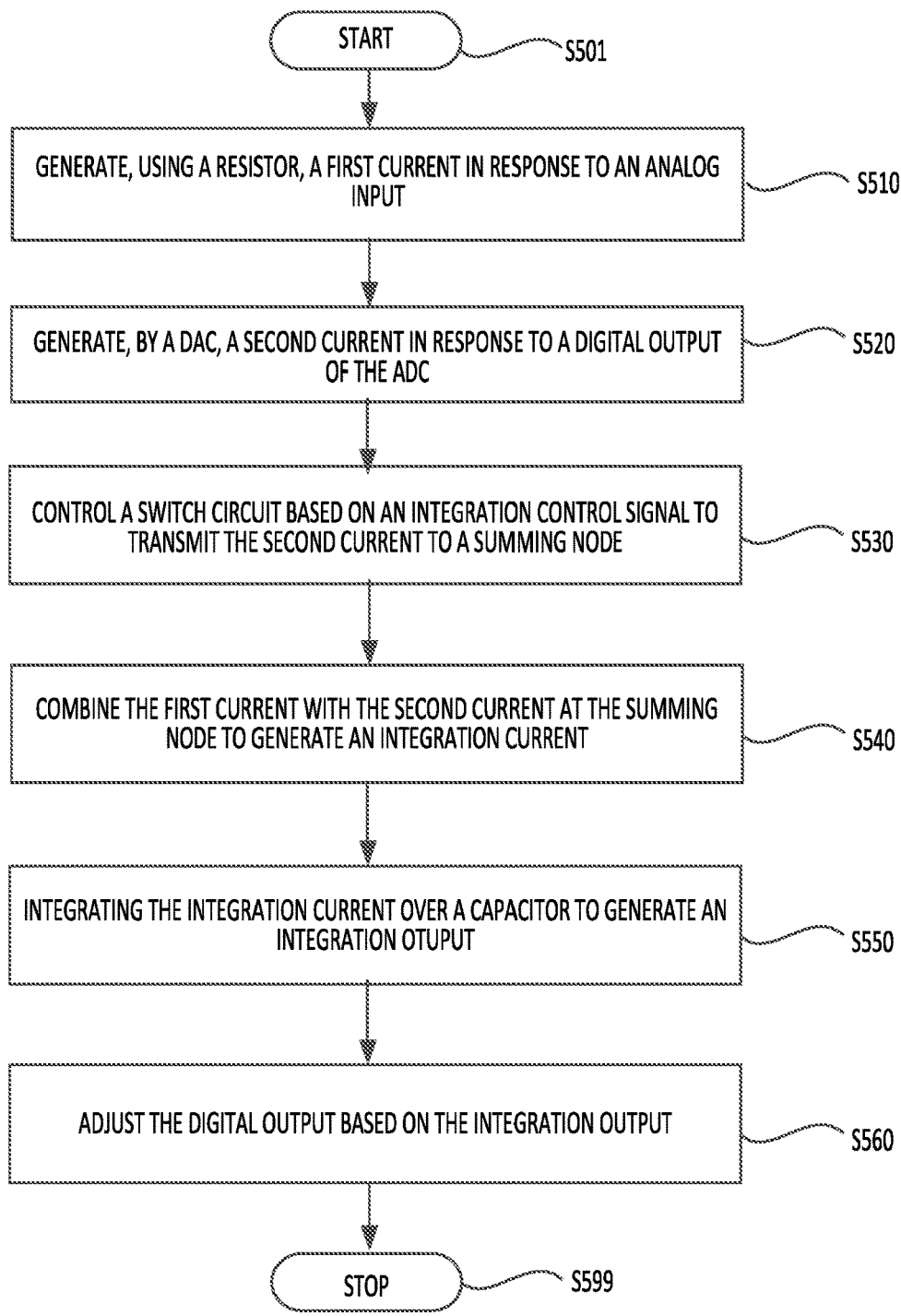
FIG. 5 shows a flow chart outlining a process according to some aspects of the disclosure.

FIG. 5 shows a flow chart outlining a process 500 according to some aspects of the disclosure. In some examples, the process 500 is executed by an ADC, such as the ADC 401. The process 500 starts at S501 and proceeds to S510.

At S510, a first current is generated by a resistor in response to an analog input. For example, the first different current is generated by the pair of resistors 421 and 422 in response to the differential input voltage signal vinp and vinn.

At S520, a second current is generated by a DAC in response to a digital output of the ADC. For example, the second differential current is generated by the DAC 450 in response to the digital output signal 445.

At S530, a switch circuit is controlled based on an integration control signal to transmit the second current to a summing node. For example, when the tri-mode DAC 405 is in the first mode, the switch circuits 464 and 465 are closed, the switch circuits 466 and 467. The switches 461 and 462 are controlled based on the integration control signal to transmit the second differential current to the summing mode.

At S540, the first current and the second current are combined at the summing node to generate an integration current. For example, the second differential current is subtracted from the first differential current to generate a differential difference current for integration.

At S550, the integration current is integrated over a capacitor to generate an integration output. For example, the differential difference current is integrated by the pair of capacitors 425 and 426 to generate the differential amplifier output voltage.

At S560, the digital output is adjusted based on the integration output. For example, the digital output signal 445 is adjusted based on the differential amplifier output voltage.

According to an aspect of the disclosure, the integration control signal is generated based on a mode of the DAC.

In some examples, in a first mode (e.g., RTZ-CT implementation) of the DAC, the integration control signal is generated as a clock signal with a constant on time in a clock period, the constant on time corresponds to an integration time.

In some examples, in a second mode (e.g., NRZ implementation) of the DAC, the integration control signal is generated with a constant non zero voltage level.

In some examples, in the first mode and the second mode, the resistor is coupled with the capacitor, and the resistor is decoupled from the switch circuit. Further, in a third mode (e.g., RTZ-SJ), the resistor is decoupled from the capacitor, and the resistor is coupled with the switch circuit. In the third mode of the DAC, the integration control signal is generated as a clock signal with an adjustable on time of a non zero voltage level in a clock period, the adjustable on time corresponds to an adjustable integration time.

In some examples, one or more configuration control signals are generated in response to a selected mode from the first mode, the second mode and the third mode of the DAC.

Figure 6:
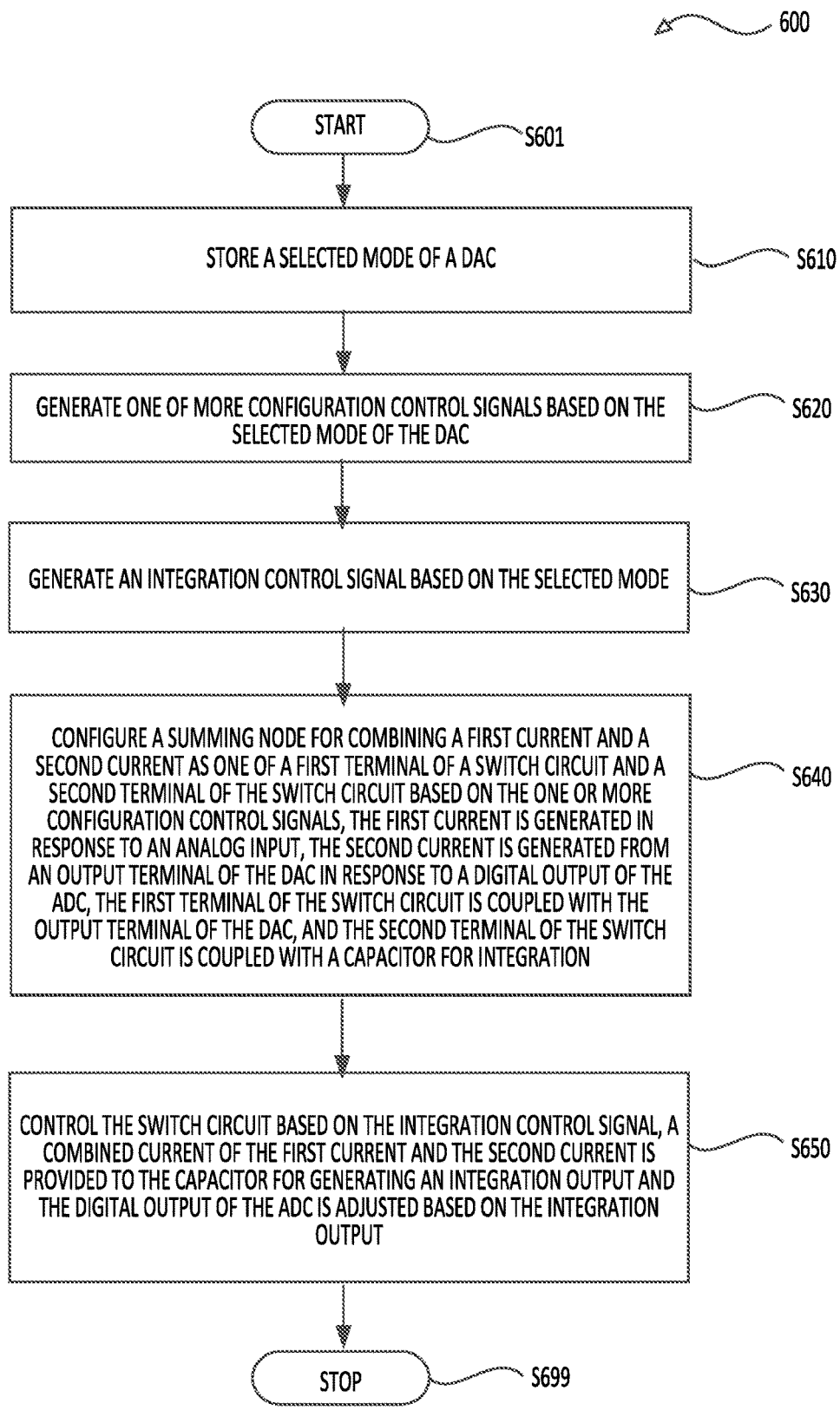
FIG. 6 shows a flow chart outlining another process according to some aspects of the disclosure.

FIG. 6 shows a flow chart outlining a process 600 according to some aspects of the disclosure. In some examples, the process 600 is executed by an ADC, such as the ADC 401. The process 600 starts at S601 and proceeds to S610.

At S610, a selected mode of DAC in the ADC is stored. In an example, the selected mode is determined by a designer for integrated circuit (IC) chip based on performance simulation of circuitry on the IC chip. In another example, the selected mode is determined by a system integrator of an electronic system (e.g., earbuds) based on system requirements. The selected mode can be stored in a non-volatile memory or other suitable technique. For example, the memory 499 is non-volatile memory and stores the mode information.

At S620, one or more configuration control signals based on the selected mode of the DAC are generated. For example, the configuration circuit 490 generates the control signals S0 and S1 based on the mode information stored in the memory 499.

At S630, an integration control signal is generated based on the selected mode of the DAC. For example, the timing control loop circuit 480 generates the integration control signals RTZ_CLK and RTZ_CLKB based on the mode information stored in the memory 499.

At S640, a summing node for combining a first current and a second current is configured as one of a first terminal of a switch circuit and a second terminal of the switch circuit based on the one or more configuration control signals, the first current is generated in response to an analog input, the second current is generated from an output terminal of the DAC in response to a digital output of the ADC, the first terminal of the switch circuit is coupled with the output terminal of the DAC, and the second terminal of the switch circuit is coupled with a capacitor for integration.

In some examples, the control signals S0 and S1 can control the switch module 460 to have the summing nodes at the first terminals (shown by A and C) of the pair of switch circuits 461 and 462 or at the second terminals (shown by B and D) of the pair of switch circuits 461 and 462.

At S650, the switch circuit is controlled based on the integration control signal. A combined current of the first current and the second current is provided to the capacitor for generating an integration output and the digital output of the ADC is adjusted based on the integration output. For example, the pair of switch circuits 461 and 462 are controlled by the integration control signal RTZ_CLK to transmit the combined current to the pair of capacitors 425 and 426 for integration. It is noted that the switch circuit 463 is controlled by the integration control signal RTZ_CLKB to short the outputs of the DAC 450 during the off time (e.g., RTZ_CLK being VSS) in a period for common mode voltage.

In some examples, the selected mode is a first mode, the one or more configuration control signals are generated to configure the summing node as the second terminal of the switch circuit. The integration control signal is as a clock signal with a constant on time in a clock period, the constant on time corresponding to an integration time. For example, in the first mode of the tri-mode DAC 405, the control signal S0 has logic 1 value and the control signal S1 has logic 0 value, the switch circuits 464 and 465 are closed, the switch circuits 466 and 467 are open. The summing modes are at the second terminals of the pair of switch circuits 461 and 462 (after the switch circuits 461 and 462). The integration control signal can have the waveform 180.

In some examples, the selected mode is a second mode, the one or more configuration control signals are generated to configure the summing node as the second terminal of the switch circuit. The integration control signal is generated with a constant non zero voltage level. For example, in the second mode of the tri-mode DAC 405, the control signal S0 has logic 1 value and the control signal S1 has logic 0 value, the switch circuits 464 and 465 are closed, the switch circuits 466 and 467 are open. The summing modes are at the second terminals of the pair of switch circuits 461 and 462 (after the switch circuits 461 and 462). The integration control signal can have the waveform 280.

In some examples, the selected mode is a third mode, the one or more configuration control signals are generated to configure the summing node as the first terminal of the switch circuit. The integration control signal is generated as a clock signal with an adjustable on time of a non zero voltage level in a clock period, the adjustable on time corresponds to an adjustable integration time. For exmaple, in the third mode of the tri-mode DAC 405, the control signal S0 has logic 0 value and the control signal S1 has logic 1 value, the switch circuits 464 and 465 are open, the switch circuits 466 and 467 are closed. The summing modes are at the first terminals of the pair of switch circuits 461 and 462 (before the switch circuits 461 and 462). The integration control signal can have the waveform 380.

The above detailed description set forth above in connection with the appended drawings describes examples and does not represent the only examples that may be implemented or that are within the scope of the claims. The term "example," when used in this description, means "serving as an example, instance, or illustration," and not "preferred" or "advantageous over other examples." The detailed description includes specific details for the purpose of providing an understanding of the described techniques. These techniques, however, may be practiced without these specific details. For example, changes may be made in the function and arrangement of elements discussed without departing from the scope of the disclosure. Also, various examples may omit, substitute, or add various procedures or components as appropriate. For instance, the methods described may be performed in an order different from that described, and various steps may be added, omitted, or combined. Also, features described with respect to some examples may be combined in other examples. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, computer-executable code or instructions stored on a computer-readable medium, or any combination thereof.

The aspects described herein may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example aspects, the functions described may be implemented in hardware, software, or any combination thereof. If implemented in software, the functions may be stored on or encoded as one or more instructions or code on a computer-readable medium. Computer-readable media includes computer storage media. Storage media may be any available media that may be accessed by a computer. By way of example, and not limitation, such computer-readable media may comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that may be used to store computer executable code in the form of instructions or data structures that may be accessed by a computer.

The various illustrative blocks and components described in connection with the disclosure herein may be implemented or performed with a specially-programmed device, such as but not limited to a processor, a digital signal processor (DSP), an ASIC, a FPGA or other programmable logic device, a discrete gate or transistor logic, a discrete hardware component, or any combination thereof designed to perform the functions described herein. A specially-programmed processor may be a microprocessor, but in the alternative, the processor may be any conventional processor, controller, microcontroller, or state machine. A specially-programmed processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a non-transitory computer-readable medium. Other examples and implementations are within the scope and spirit of the disclosure and appended claims. For example, due to the nature of software, functions described above may be implemented using software executed by a specially programmed processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C).

Computer-readable media includes both computer storage media and communication media including any medium that facilitates transfer of a computer program from one place to another. A storage medium may be any available medium that may be accessed by a general purpose or special purpose computer. By way of example, and not limitation, computer-readable media may comprise RAM, ROM, EEPROM, CD-ROM or other optical disk storage, magnetic disk storage or other magnetic storage devices, or any other medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the common principles defined herein may be applied to other variations without departing from the spirit or scope of the disclosure. Furthermore, although elements of the described aspects may be described or claimed in the singular, the plural is contemplated unless limitation to the singular is explicitly stated. Additionally, all or a portion of any aspect may be utilized with all or a portion of any other aspect, unless stated otherwise. Thus, the disclosure is not to be limited to the examples and designs described herein but is to be accorded the widest scope consistent with the principles and novel features disclosed herein.

What is claimed is:

1. An integrated circuit, comprising:
   an analog-to-digital converter (ADC) comprising:
   a continuous-time integrator including:
   an amplifier having an amplifier input and an amplifier output,
   a capacitor coupled between the amplifier input and the amplifier output, and a resistor with a first resistor terminal configured to receive an analog input and a second resistor terminal coupled to the amplifier input, the resistor configured to provide a first current for an integration in response to the analog input;

a digital-to-analog converter (DAC) configured to generate a second current at a DAC output based on a digital output of the ADC; and a switch module comprising:
multiple configurable switch circuits responsive to one or more configuration control signals, with a configuration of the multiple configurable switch circuits providing a summing node; and a switch circuit having a first switch circuit terminal coupled with the DAC output and a second switch circuit terminal coupled with the amplifier input, with the switch circuit configured to couple the DAC output with the amplifier input for a summation, at the summing node, of the second current with the first current for the integration based on an integration control signal.

2. The integrated circuit of claim 1, further comprising:
an integration control generator configured to generate the integration control signal based on a mode of the DAC.

3. The integrated circuit of claim 2, wherein in a first mode of the DAC:
the integration control generator is configured to generate the integration control signal as a clock signal with a constant on time in a clock period, the constant on time corresponding to an integration time for the continuous-time integrator.

4. The integrated circuit of claim 3, wherein the integration control generator comprises:
a timing control loop circuit configured to generate the clock signal with the constant on time set based on a resistor-capacitor time constant.

5. The integrated circuit of claim 3, wherein in a second mode of the DAC:
the integration control generator is configured to generate the integration control signal with a constant non-zero voltage level.

6. The integrated circuit of claim 5, further comprising:
a first configuration switch of the multiple configurable switch circuits configured to couple the second resistor terminal with the amplifier input in the first mode and the second mode of the DAC; and
a second configuration switch of the multiple configurable switch circuits configured to decouple the second resistor terminal from the first switch circuit terminal of the switch circuit in the first mode and the second mode of the DAC.

7. The integrated circuit of claim 6, wherein:
the first configuration switch is configured to decouple the second resistor terminal from the amplifier input in a third mode of the DAC; and
the second configuration switch is configured to couple the second resistor terminal with the first switch circuit terminal of the switch circuit in the third mode of the DAC.

8. The integrated circuit of claim 7, wherein in the third mode of the DAC:
the integration control generator is configured to generate the integration control signal as a clock signal with an adjustable on time of a non-zero voltage level in a clock period, the adjustable on time corresponding to an adjustable integration time for the continuous-time integrator.

9. The integrated circuit of claim 7, further comprising:
a configuration circuit configured to generate the one or more configuration control signals to control the first configuration switch and the second configuration switch in response to a selected mode from the group of the first mode, the second mode, and the third mode of the DAC.

10. A method of operating an analog-to-digital converter (ADC), comprising:
providing, by a resistor, a first current in response to an analog input;
generating, by a digital-to-analog converter (DAC), a second current in response to a digital output of the ADC;
configuring, using one or more configuration control signals, multiple configurable switch circuits to provide a summing node;
controlling a switch circuit based on an integration control signal to transmit the second current to the summing node;
combining the first current and the second current at the summing node to generate an integration current;
integrating the integration current over a capacitor to generate an integration output; and
adjusting the digital output based on the integration output.

11. The method of claim 10, further comprising:
generating the integration control signal based on a mode of the DAC.

12. The method of claim 11, wherein in a first mode of the DAC, the method further comprises:
generating the integration control signal as a clock signal with a constant on time in a clock period, the constant on time corresponding to an integration time.

13. The method of claim 12, wherein in a second mode of the DAC, the method further comprises:
generating the integration control signal with a constant non-zero voltage level.

14. The method of claim 13, further comprising:
coupling the resistor with the capacitor in the first mode and the second mode of the DAC; and
decoupling the resistor from the switch circuit in the first mode and the second mode of the DAC.

15. The method of claim 14, further comprising:
decoupling the resistor from the capacitor in a third mode of the DAC; and
coupling the resistor with the switch circuit in the third mode of the DAC.

16. The method of claim 15, wherein in the third mode of the DAC, the method further comprises:
generating the integration control signal as a clock signal with an adjustable on time of a non-zero voltage level in a clock period, the adjustable on time corresponding to an adjustable integration time.

17. The method of claim 15, further comprising:
generating one or more configuration control signals in response to a selected mode from the group of the first mode, the second mode, and the third mode of the DAC.

18. A method of using an analog-to-digital converter (ADC), comprising:
storing a selected mode of a digital-to-analog converter (DAC) in the ADC;
generating one or more configuration control signals based on the selected mode of the DAC;
generating an integration control signal based on the selected mode of the DAC;

configuring, based on the one or more configuration control signals, one of a first terminal of a switch circuit or a second terminal of the switch circuit as a summing node to combine a first current and a second current, the first current being generated in response to an analog input and the second current being generated by the DAC in response to a digital output of the ADC, with the first terminal of the switch circuit being coupled with an output terminal of the DAC and the second terminal of the switch circuit being coupled with a capacitor for integration; and controlling the switch circuit based on the integration control signal, wherein a combined current resulting from combining the first current and the second current is provided to the capacitor to generate an integration output and the digital output of the ADC is adjusted based on the integration output.

19. The method of claim 18, wherein the selected mode is a first mode, the method further comprising:

generating the one or more configuration control signals that configure the second terminal of the switch circuit as the summing node; and generating the integration control signal as a clock signal with a constant on time in a clock period, the constant on time corresponding to an integration time.

20. The method of claim 19, wherein the selected mode is a second mode, the method further comprising:

generating the one or more configuration control signals that configure the second terminal of the switch circuit as the summing node; and generating the integration control signal with a constant non-zero voltage level.

21. The method of claim 20, wherein the selected mode is a third mode, the method further comprising:

generating the one or more configuration control signals that configure the first terminal of the switch circuit as the summing node; and generating the integration control signal as a clock signal with an adjustable on time of a non-zero voltage level in a clock period, the adjustable on time corresponding to an adjustable integration time.

\* \* \* \* \*